United States Patent [19]
Burns et al.

[11] Patent Number: 6,020,562
[45] Date of Patent: Feb. 1, 2000

[54] REDUCED-CAPACITANCE COMPONENT MOUNTING PADS AND CAPACITANCE-REDUCTION METHODS FOR HIGH FREQUENCY MULTI-LAYER PRINTED CIRCUIT BOARDS

[75] Inventors: Lawrence M. Burns, Mountain View; Nicholas Mitchell, Fremont; Theresa Bradshaw, Morgan Hill; Chong Woo, Fremont, all of Calif.

[73] Assignee: 3Com Corporation, Santa Clara, Calif.

[21] Appl. No.: 08/967,489

[22] Filed: Nov. 11, 1997

[51] Int. Cl.[7] .............................. H01R 9/09; H01R 23/68; H05K 1/11
[52] U.S. Cl. .......................... 174/261; 174/260; 361/767
[58] Field of Search ............................ 361/767; 174/260, 174/255

[56] References Cited

U.S. PATENT DOCUMENTS

| | | | |
|---|---|---|---|
| 4,889,961 | 12/1989 | Carlson | 29/846 |
| 5,375,035 | 12/1994 | Stoddard | 361/306.2 |
| 5,459,642 | 10/1995 | Stoddard | 361/774 |
| 5,466,892 | 11/1995 | Howard et al. | 174/261 |
| 5,729,438 | 3/1998 | Pieper et al. | 361/760 |
| 5,812,379 | 9/1998 | Barrow | 361/773 |

*Primary Examiner*—Kristine Kincaid
*Assistant Examiner*—Jeremy Norris
*Attorney, Agent, or Firm*—Koppel & Jacobs

[57] ABSTRACT

Component mounting pads for multi-layer printed circuit boards encompass a smaller area than conventional pads, reducing parasitic capacitance between the pads and a ground plane layer. A number of such pads are arranged to accommodate standard surface-mount component sizes and packages. Further capacitance reductions are achieved by implementing mesh areas or apertures in the board's ground plane opposite the reduced-capacitance pads.

11 Claims, 8 Drawing Sheets

REDUCED-CAPACITANCE COMPONENT MOUNTING PADS AND CAPACITANCE-REDUCTION METHODS FOR HIGH FREQUENCY MULTI-LAYER PRINTED CIRCUIT BOARDS

BACKGROUND OF THE INVENTION

1. Field of the Invention

The invention is related to printed circuit boards which support high frequency electronics, and in particular to techniques for reducing parasitic capacitance between board layers.

2. Description of the Related Art

Printed circuit boards (PCBs) have been employed for many years to physically support and interconnect electronic circuit elements: passive and active, analog and digital, of low-levels and high-levels of integration. At low operational frequencies, circuit impedances are typically mismatched. However, with high frequency circuits it is important to match source and load impedances to prevent reflections and signal degradation. At high frequencies, the conductive traces which route signals among various board-mounted components (whose electrical characteristics can largely be ignored at low frequencies), operate as microstrip transmission lines having a characteristic impedance $Z_0$, which is given by:

$$Z_0 = \sqrt{(L/C)} \qquad \text{(Eq. 1)}$$

where L and C are the inductance and capacitance of the trace per unit length. Preferably, the impedance of the transmission lines matches that of the source and load; this condition provides maximum power transfer.

Figure 1A:
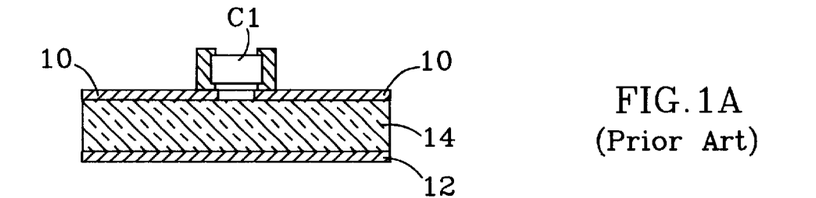
FIG. 1A, as described above, is a cross-section view of two layers of a relatively thick known PCB, cut along section line 1A—1A in FIG. 1B.
Figure 1B:
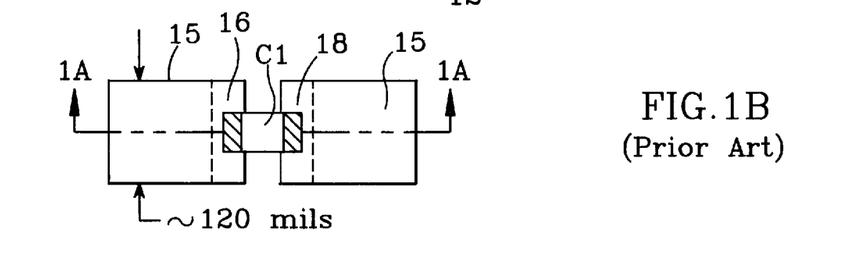
FIG. 1B, as described above, is top plan view of the known PCB in FIG. 1A, showing a circuit trace and a chip component which might be found at the PCB's top layer.
Figure 1C:
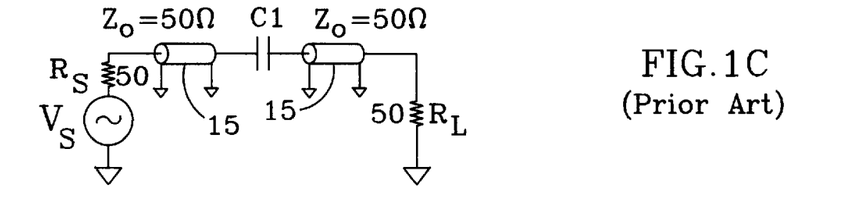
FIG. 1C, as described above, is a schematic diagram of an equivalent circuit which includes the trace and component shown in FIGS. 1A and 1B.

FIG. 1A is a cross-sectional view of two metal layers of a conventional multi-layer board (cut along section line 1A—1A in FIG. 1B) illustrating an RF signal layer 10 and an RF ground plane, 12, each typically about 0.7 mils (0.018 mm) thick (½ oz. (14.18 gm) plating) or 1.4 mils (0.0356 mm) thick (1 oz. (28.35 gm) plating), with a dielectric layer 14, commonly about 62 mils (1.57 mm) thick, sandwiched between the two RF layers. Signal layer 10 is composed of signal traces, with spaces between the traces; it is not a solid plane of conductive material. As illustrated in FIG. 1B, a 50Ω trace 15 such as would be found in the board's RF signal layer 10 (FIG. 1A) is about 120 mils (3.05 mm) wide. A surface-mount capacitor C1, 60 mils by 30 mils (1.52 mm×0.76 mm) in size, for example, is soldered to component mounting pads 16 and 18 and joins the illustrated trace segments. At 30 mils in width, C1 is substantially narrower than the traces. An equivalent circuit is illustrated in FIG. 1C, with the 50Ω transmission lines 15 connecting capacitor C1 between a signal source $V_S$ having a source impedance $R_S$ of 50Ω and a load having an impedance $R_L$ of 50Ω. The component mounting pads 16 and 18 and the traces 15 to which they are connected are about the same width, and as such have no adverse affect on the line impedance.

Figure 2A:
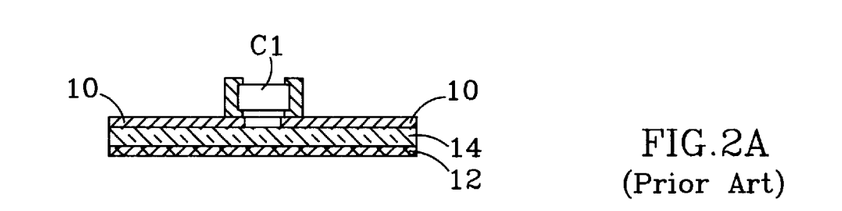
FIG. 2A, as described above, is a cross-section view of two layers of a relatively thin known PCB, cut along section line 2A—2A in FIG. 2B.
Figure 2B:
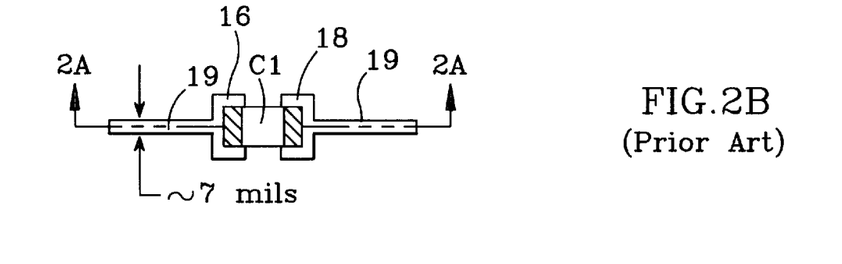
FIG. 2B, as described above, is top plan view of the known PCB in FIG. 2A, showing a circuit trace and a chip component which might be found at the PCB's top layer.
Figure 2C:
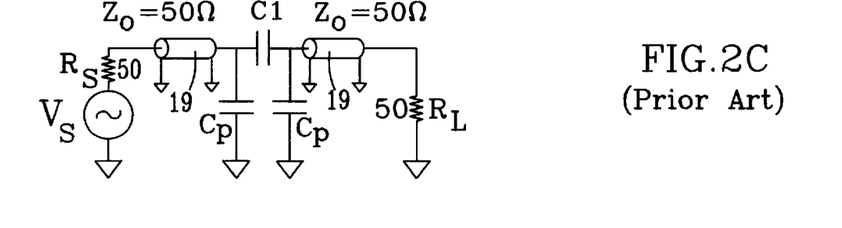
FIG. 2C, as described above, is a schematic diagram of an equivalent circuit of the trace and component shown in FIGS. 2A and 2B.

As board densities increase, both the thickness of the board and the width of the circuit traces are reduced. FIG. 2A is a cross-sectional view of two metal layers of a much thinner multi-layer board (cut along section line 2A—2A in FIG. 2B) illustrating an RF signal layer 10 and an RF ground plane 12, each still about 0.7 mils (0.018 mm) thick, and a dielectric layer 14 which is only about 4 mils (0.102 mm) thick sandwiched between the two RF layers. At this dielectric thickness, a 50Ω transmission line 19 in the RF signal layer of FIG. 2A is about 7 mils (0.178 mm) wide, as illustrated in FIG. 2B, with capacitor C1 now substantially wider than the traces. The component mounting pads 16, 18 upon which the capacitor C1 is soldered are conventionally about 40 mils×40 mils (1.02 mm×1.02 mm) for 30 mil wide capacitor C1, with the pads' 5 mil overlap on either side of C1 needed to accommodate component placement and manufacturing tolerances. Now, however, because the pads are so much wider than the traces 19, the parasitic capacitance $C_P$ which exists between pads 16 and 18 and ground plane 12 can be significant, making a desired line impedance difficult to achieve and causing serious problems for high frequency signals. An equivalent circuit is shown in FIG. 2C: the parasitic capacitances $C_P$ to ground interfere with the intended operation of the circuit, generally causing it to have an undesirable low-pass response.

Specifications have been developed by the PCB industry for the manufacturing of boards intended for use with surface-mount components. The specifications allot a certain amount of board area, referred to as the "chip component size", for each resistor, inductor and capacitor to be placed on the board. For example, an "0603" board allots a nominal area of 60 mils×30 mils (1.52 mm×0.76 mm) for each component. 60 mils×30 mils capacitor C1 is an example of an "0603" component. An "0402" board allots 40 mils×20 mils (1.02 mm×0.51 mm) for each component, an "0805" board allots 80 mils×50 mils (2.03 mm×1.27 mm), and a "1206" board allots 120 mils×60 mils (3.05 mm×1.52 mm).

In conjunction with establishing standard chip component sizes, the PCB industry has also specified standard mounting pad dimensions for each component size, which define the size, shape and spacing of the component mounting pads to which the components are to be attached; these dimensions are referred to herein as the "conventional pad" dimensions.

Figure 3A:
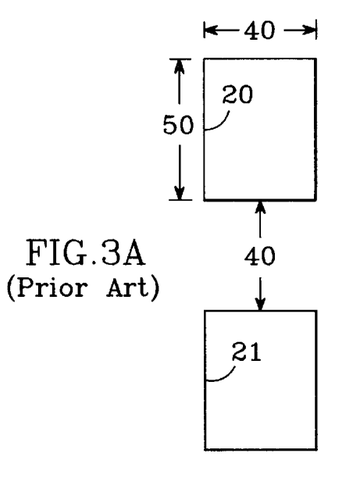
FIGS. 3A–3C are plan views of prior art 0805, 0603 and 0402 component mounting pads, respectively. All dimensions shown are in mils.
Figure 3B:
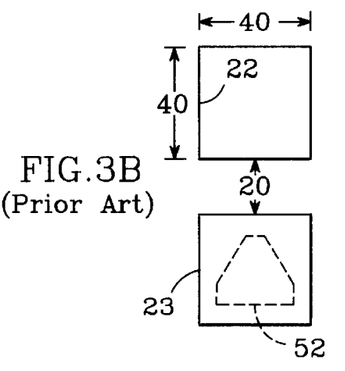
Figure 3C:
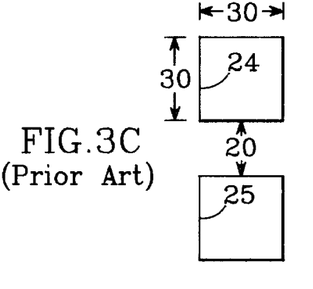

Conventional pad dimensions are shown for three standard component sizes in FIGS. 3A–3C, with all dimensions shown in mils. A pair of conventional "0805" component mounting pads 20 and 21 is shown in FIG. 3A. Each pad has dimensions of 40 mils×50 mils (1.02 mm×1.27 mm), and is to be spaced 40 mils apart (1.02 mm). A pair of "0603" pads 22 and 23 is shown in FIG. 3B; each pad has dimensions of 40 mils×40 mils (1.02 mm×1.02 mm) and a spacing of 20 mils (0.51 mm). A pair of 30 mils×30 mils (0.76 mm×0.76 mm) "0402" pads 24 and 25 is shown in FIG. 3C, with a spacing of 20 mils. These industry standard pad dimensions were selected to insure a PCB's manufacturability, with consideration given to the tolerances allowed for component size, component placement and X-Y alignment, as well as to the pad's function of providing an electrically and mechanically sound solder joint. The specified dimensions are also intended to help control the positioning of a component for solder paste/reflow and to prevent component rotation or skewing; i.e., standard mounting pads allow a component to "self-align" on the pads as the solder cools.

However, because each of the industry standard pad sizes in FIGS. 3A–3C exceeds the width of a high-density board trace such as the 7 mil wide trace shown in FIG. 2B, their use contributes to the parasitic capacitance and impedance matching problems discussed above.

Figure 4A:
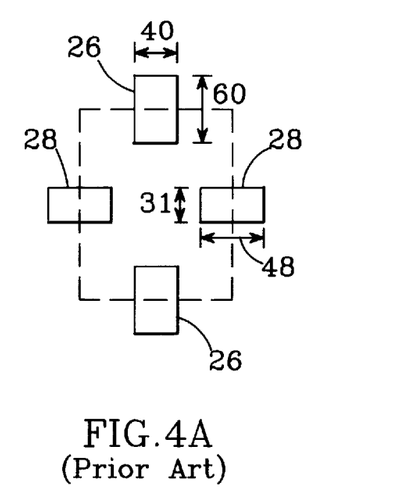
FIGS. 4A–4C are plan views of prior art component mounting pad layouts for commercially available industry standard 4, 7 and 12-pin high frequency filter packages. All dimensions shown are in mils.
Figure 4B:
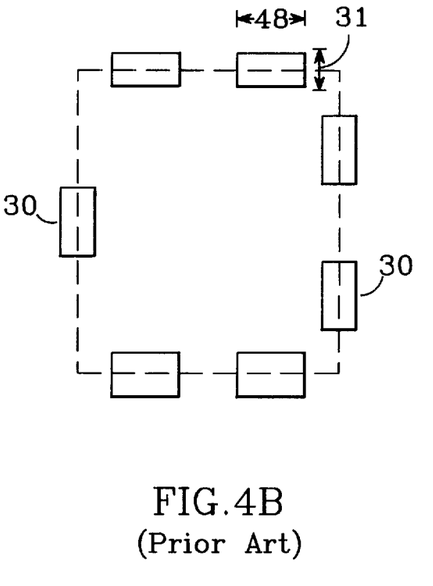
Figure 4C:
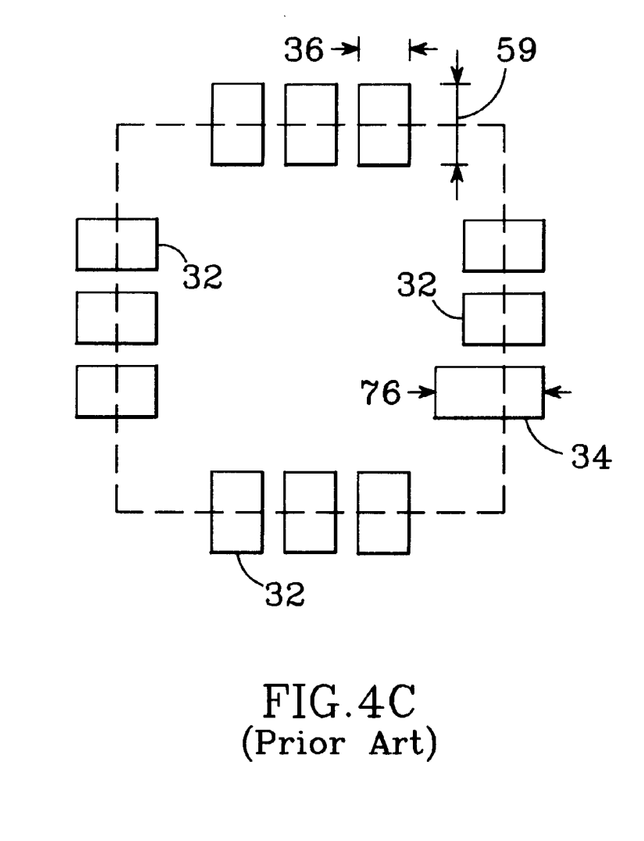

Similar problems can arise when an array of component mounting pads is arranged in a pattern to accommodate a multiple pin-out device. For example, the plan views of FIGS. 4A–4C show component mounting pad layouts and dimensions for use with three commercially available surface-mount filter packages, for which manufacturer's suggested component mounting pad sizes have been established. FIG. 4A shows a pad layout for a 4-pin 2.4 GHz L-C bandpass filter package made by the Murata Corp. in Smyrna, Ga. Two of the pads 26 have dimensions of 40 mils×60 mils (1.02 mm×1.52 mm) and two of the pads 28 are 48 mils×31 mils (1.22 mm×0.79 mm). FIG. 4B shows a pad layout for a 7-pin 2.4 GHz input bandpass resonator filter package made by Toko Corp. in Mt. Prospect, Ill., in which all pads 30 are 48 mils×31 mils (1.22 mm×0.79 mm). FIG. 4C shows a pad layout for a 12-pin 500 MHZ surface acoustic wave (SAW) filter package made by Sawtek Corp. in Orlando, Fla., in which all of the pads 32 are 36 mils×59 mils (0.91 mm×1.50 mm), with the exception of one slightly longer pad 34 of 36 mils×76 mils (0.91 mm×1.93 mm). The outlines of the various filter packages are shown as dashed lines in FIGS. 4A, 4B and 4C. Because the mounting pads are likely to be much larger than the signal traces found on a high density PCB, they can cause the same types of parasitic capacitance and impedance matching problems discussed above in connection with the industry standard component mounting pads.

PCBs made of exotic materials, such as "TEFLON"— derivative boards, are sometimes used to achieve good high frequency performance, but these boards tend to be very costly, and often cannot accommodate more than two layers.

Each component mounting pad which is wider than its PCB's signal traces tends to introduce an undesirable capacitance to a high frequency circuit design. It is therefore desirable to overcome the effects of this unwanted parasitic capacitance to accommodate high-density, high frequency circuit designs.

SUMMARY OF THE INVENTION

The invention reduces the parasitic capacitance associated with the component mounting pads on a PCB and thereby lessens its effect on the impedance of high frequency transmission lines. In particular, the component mounting pads, to which electronic components are soldered, are formed in such a way as to exhibit lower capacitance than conventional mounting pads.

The invention comprises mounting pads which each have a smaller surface area than "conventional" pads. Dimensions are specified for these conventional pads, chosen to provide sufficient surface area to accommodate component placement, solder, and X-Y alignment tolerances. Because of their reduced area, the new pads exhibit lower parasitic capacitance than conventional pads, enabling the achievement of line impedances that might otherwise be unattainable. Reducing the parasitic capacitance attributable to component mounting pads also enables the use of conventional epoxy-glass PCBs for high frequency circuitry, avoiding the high cost and configuration compromises which are often necessary with exotic material boards.

In a preferred embodiment, the pads are each shaped somewhat like a truncated home plate, i.e., with a combination of trapezoidal and rectangular areas, and which occupy less surface area than corresponding conventional pads. Solder is typically placed on a mounting pad in a certain pattern prior to a component being bonded to it. The pad's truncated homeplate shape matches that of a solder pattern known to produce good mechanical and electrical bonds. Pads of this shape thus provide a lower parasitic capacitance than equivalent conventional pads, while maintaining the manufacturability, reliability and structural integrity of conventional rectangular pads. Other reduced area component mounting pad shapes are also shown, usable with a number of industry standard surface-mount component sizes, which also achieve a desired reduction in parasitic capacitance. Arrays of component mounting pads arranged to accommodate multiple-pinout packages, and which incorporate one or more reduced-capacitance pads, are also presented.

Further reductions in mounting-pad related parasitic capacitance may be achieved by reducing the area of the ground plane that underlies the mounting pad. In one embodiment, a reduced-capacitance ground plane is formed with conductive mesh underneath reduced-capacitance component mounting pads of interest, with a conventional solid plane of conductive material in other areas. In those cases where further reductions in capacitance are necessary, "apertures" are formed in the ground plane opposite some mounting pads.

These and other features, aspects and advantages of the invention will be apparent to those skilled in the art from the following detailed description, taken together with the accompanying drawings.

DETAILED DESCRIPTION OF THE INVENTION

A new component mounting pad is presented for use with a multi-layer printed circuit board (PCB) which supports high frequency circuit operation on a relatively thin layer of dielectric material. The dielectric material, suitably a thin layer of conventional glass fiber epoxy compound, provides mechanical support for electronic components placed on at least one of the board's surfaces. The PCB's layer(s) of conductive traces interconnect electronic components that operate at relatively high speeds. A layer of dielectric material separates the high speed circuit layer from a ground plane that provides both a shield from other signal layers and a very low impedance ground reference point for the high speed circuitry. When the frequencies of signals carried on the conductive traces exceed about 10–100 MHz, the traces act as transmission lines and it becomes desirable to have the lines' impedances match the source and load impedances connected to the trace, to reduce reflections and signal degradation, and to provide maximum power transfer. The new, reduced-capacitance component mounting pads and the related techniques discussed below permit such impedance matching, which may be unattainable with larger prior art pads.

Figure 5A:
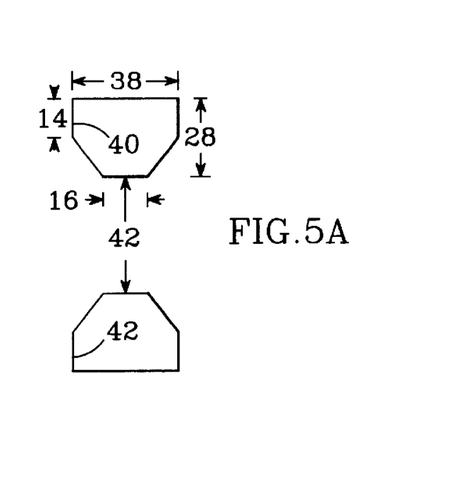
FIGS. 5A–5C are plan views of new reduced-capacitance component mounting pads for use with 0805, 0603 and 0402 component chip sizes, respectively. All dimensions shown are in mils.

One embodiment of a component mounting pad per the present invention is shown in FIG. 5A. Two pads 40 and 42 are shown, each of which corresponds with the prior art pair of standard 0805 pads shown in FIG. 3A. Each of pads 40 and 42 is made up of a trapezoidal area combined with a rectangular area and resembles a truncated home plate. The pads' dimensions and shape yield several benefits: the surface area of pads 40 and 42 is less than that occupied by corresponding conventional pads, which reduces the parasitic capacitance between pad and ground plane (e.g., layer 12 of FIG. 2B) when compared with a standard pad. This lower capacitance enables the conductive trace/transmission line to which it is attached to have a desired impedance, which is particularly important for lines carrying high frequency signals. Referring to the impedance formula stated in Eq. 1, lowering the parasitic capacitance induced by the pads increases the achievable impedance of the conductive trace to which the pad is attached, so that use of the new pads makes possible line impedance values that are unattainable with conventional pads. The new pads can be used in conjunction with one or more of the ground plane modifications discussed below to "tune" the impedance of a trace to a desired value. Alternatively, it may be desirable that the mounting pads simply induce as low a capacitance as possible, when, for example, a circuit requires a high input impedance. The reduced area pads herein described also contribute towards this goal.

The new 0805 pads 40 and 42 preferably have an overall width of about 38 mils (0.97 mm), an overall length of about 28 mils (0.71 mm), and a spacing between pads of about 42 mils (1.07 mm). Other pad dimensions are as shown in FIG. 5A. 0805 pads having the shape and dimensions shown occupy only 45.5% as much surface area as is covered by the prior art standard pads. Capacitance is directly related to area by the formula $C=\epsilon A/d$ (neglecting fringing capacitance), with $\epsilon$ being the permittivity of the dielectric material between the capacitor's plates, A is the area of the plates, and d is the spacing between the plates. Thus for the new 0805 pad, a 45.5% reduction in its area reduces the parasitic capacitance between the pad and the PCB's ground plane by approximately 48% (approximate because fringing capacitance is neglected).

Figure 5B:
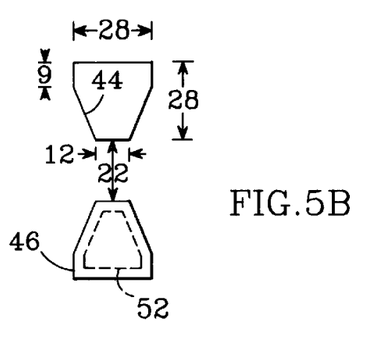

Two new 0603 pads 44 and 46 are shown in FIG. 5B, which correspond to the prior art conventional pad shown in FIG. 3B. The 0603 pads 44 and 46 preferably have a truncated home plate shape similar to the 0805 pads of FIG. 5A, have an overall width of about 28 mils (0.71 mm), an overall length of about 28 mils (0.71 mm), and are spaced about 22 mils (0.56 mm) apart. Other pad dimensions are as shown in FIG. 5B. 0603 pads having the shape and dimensions shown occupy only 39.5% of the surface area covered by the prior art standard pads and will reduce parasitic capacitance by about 39%.

Figure 5C:
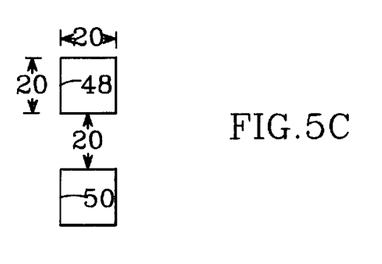

Two new 0402 pads 48 and 50 are shown in FIG. 5C, which correspond to the prior art conventional pad shown in FIG. 3C. The 0402 pads 48 and 50 preferably have an overall width of about 20 mils (0.51 mm), an overall length of about 20 mils (0.51 mm), and are spaced about 20 mils (0.51 mm) apart. 0402 pads having the shape and dimensions shown occupy only 44.4% of the surface area covered by the prior art standard pads, with a resulting reduction in parasitic capacitance of about 44%. These 0402 pads, smaller in both length and width dimensions than the new 0603 and 0805 pads described above, are square-shaped. This is due to the limitations of the silk screening process typically used to produce them—a truncated home plate shape would be preferable if such pads could be cost-effectively produced.

The truncated home plate shape of the pads described in connection with FIGS. 5A and 5B also contributes to their superiority over corresponding conventional pads. As shown in FIG. 3B, solder paste 52 is typically applied to a mounting pad 23 prior to a component being placed in contact with it. The "footprint" of the paste 52 on a conventional square pad 23 often has a truncated home plate shape, because this shape tends to provide a good solder connection. The component's lead is placed at the narrow end of the paste and the paste heated. Because of the paste's shape, the solder tends to be drawn to the lead when melted, resulting in a thin layer of solder under the lead which provides a good electrical connection, and a good round solder fillet over and around the lead, providing good mechanical strength to the solder bond.

Referring back to FIGS. 5A and 5B, the shape of the preferred mounting pad is made to track that of the paste footprint 52, with pad surface area not needed for either electrical or mechanical reasons eliminated. A component lead contacts the pad via the pad's narrow side, where the trapezoidal section allows the advantageous drawn solder effect to be maintained. The rectangular section is kept large enough to insure that the solder bond will be mechanically sound.

The new mounting pad shapes and dimensions shown in FIGS. 5A–5C, as well as those discussed below, were each designed to reduce surface area as much as possible, while still providing 1) adequate solder reflow and wetting when solder paste is used, 2) sufficient mechanical strength when a component lead is attached, and 3) a high yield of good solder connections. The overall length of the pads is not reduced so much that the manufacturability of the printed circuit board is affected, i.e., standard solder paste patterns fit well within the perimeter of the pads and there is sufficient length to accommodate placement errors and to provide a mechanically sound solder joint.

The use of reduced-capacitance pads is not limited to the standard surface-mount component sizes discussed above.

The concept is applicable whenever mounting pad-related parasitic capacitance degrades the performance of the resident circuitry. However, careful attention must be paid to the manufacturability considerations itemized above, so that a pad's area is not reduced to such a degree as to make it difficult or impossible to obtain a mechanically and electrically reliable bond.

Figure 6A:
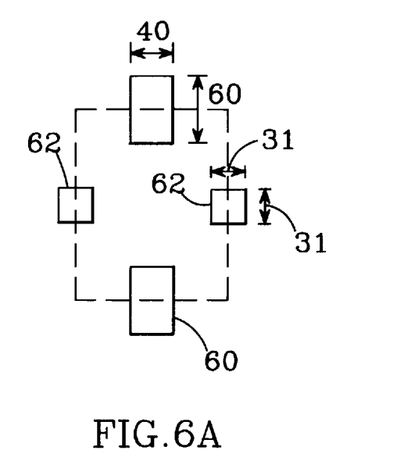
FIGS. 6A–6C are plan views of new component mounting pad layouts for commercially available industry standard 4, 7 and 12-pin high frequency filter packages which incorporate reduced-capacitance component mounting pads per the present invention. All dimensions shown are in mils.
Figure 6B:
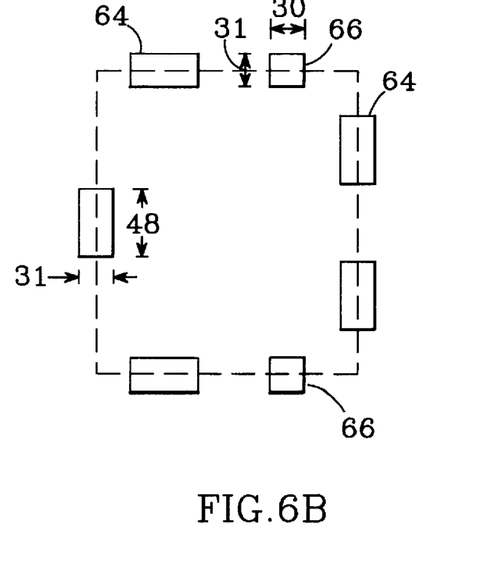
Figure 6C:
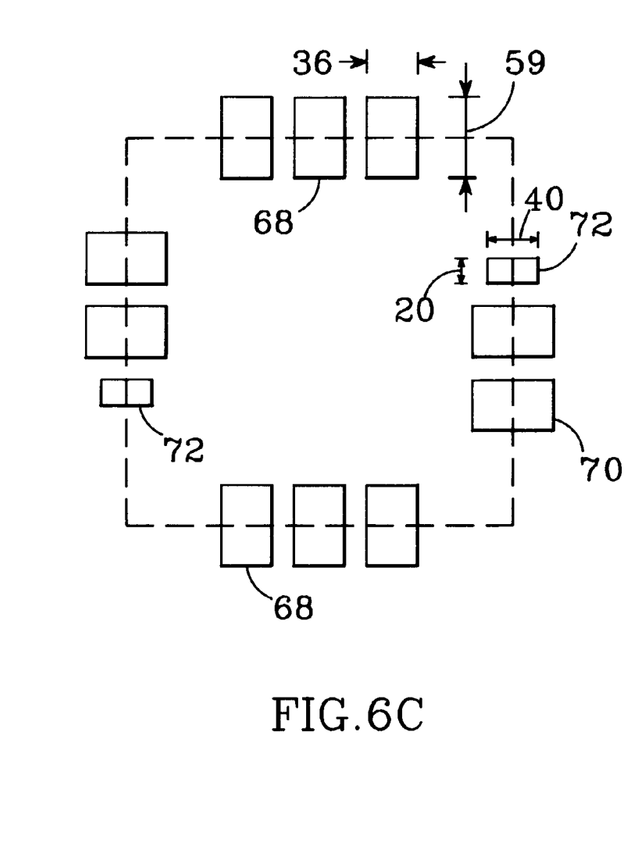

In addition to its applicability to two-terminal components like resistors and capacitors, the reduced-capacitance pad concept is also applicable to mounting pad layouts for electronic packages with multiple pinouts. New pad layouts which correspond to the prior art conventional pad layouts shown in FIGS. 4A–4C are shown in FIGS. 6A–6C. The 4-pin 2.4 GHz L-C bandpass filter package pad layout in FIG. 6A has two pads 60 which are unchanged from the prior art, complying with the manufacturer's suggested pad size of 40 mils×60 mils (1.02 mm×1.52 mm). However, two pads 62 are reduced-capacitance pads, having dimensions of about 31 mils×31 mils (0.79 mm×0.79 mm) each. The reduction in the area of these two pads causes a commensurate reduction in the parasitic capacitance which exists between the pads making up the layout and the ground plane.

FIG. 6B is a pad layout for the 7-pin 2.4 GHz input bandpass resonator filter package. All of the pads 64, except two, are unchanged from their prior art dimensions of 48 mils×31 mils (1.22 mm×0.79 mm). However, two pads 66 are preferably reduced-capacitance pads, with dimensions of 30 mils×31 mils (0.76 mm×0.79 mm).

Similarly, the pad layout for the SAW filter package in FIG. 6C has all but two of its pads 68 unchanged from their prior art dimensions of 36 mils×59 mils (0.91 mm×1.50 mm) (with one pad 70 having dimensions of 36 mils×76 mils (0.91 mm×1.93 mm). However, two pads 72 are preferably reduced-capacitance pads, with dimensions of 20 mils×40 mils (0.51 mm×1.02 mm). The respective filter package outlines are shown as dashed lines in FIGS. 6A, 6B and 6C.

Reduced-capacitance pads are particularly useful with the filters which the layouts in FIGS. 6A–6C are intended to accommodate, because the high frequency signals they are designed to filter are easily degraded in the presence of unwanted parasitic capacitances. In FIGS. 6A, 6B and 6C, the reduced-capacitance pads, i.e., pads 62, 66 and 72 are each intended for connection to signal leads that carry high frequency signals; the remaining pads are typically for connection to the ground pins of the filter packages, for which no shrinkage of pad area is necessary or desirable. It is, in fact, desirable to have the ground pads remain at their conventional sizes, because they can then be utilized to provide a strong mechanical bond for the filter package to which they are soldered. Since the conventional pads provide the necessary mechanical strength, the mechanical constraints on the signal lead/reduced-capacitance pad bonds are reduced and the reduced-capacitance pads can be made even smaller.

As stated in connection with the two-mounting pad configurations of FIGS. 5A–5C, the use of reduced-capacitance pads in mounting pad layouts is not limited to the filter package layouts discussed above, which are intended as merely illustrative. The concept is applicable whenever mounting pad-related parasitic capacitance degrades the performance of the circuitry connected to the pads of the layout.

Figure 7A:
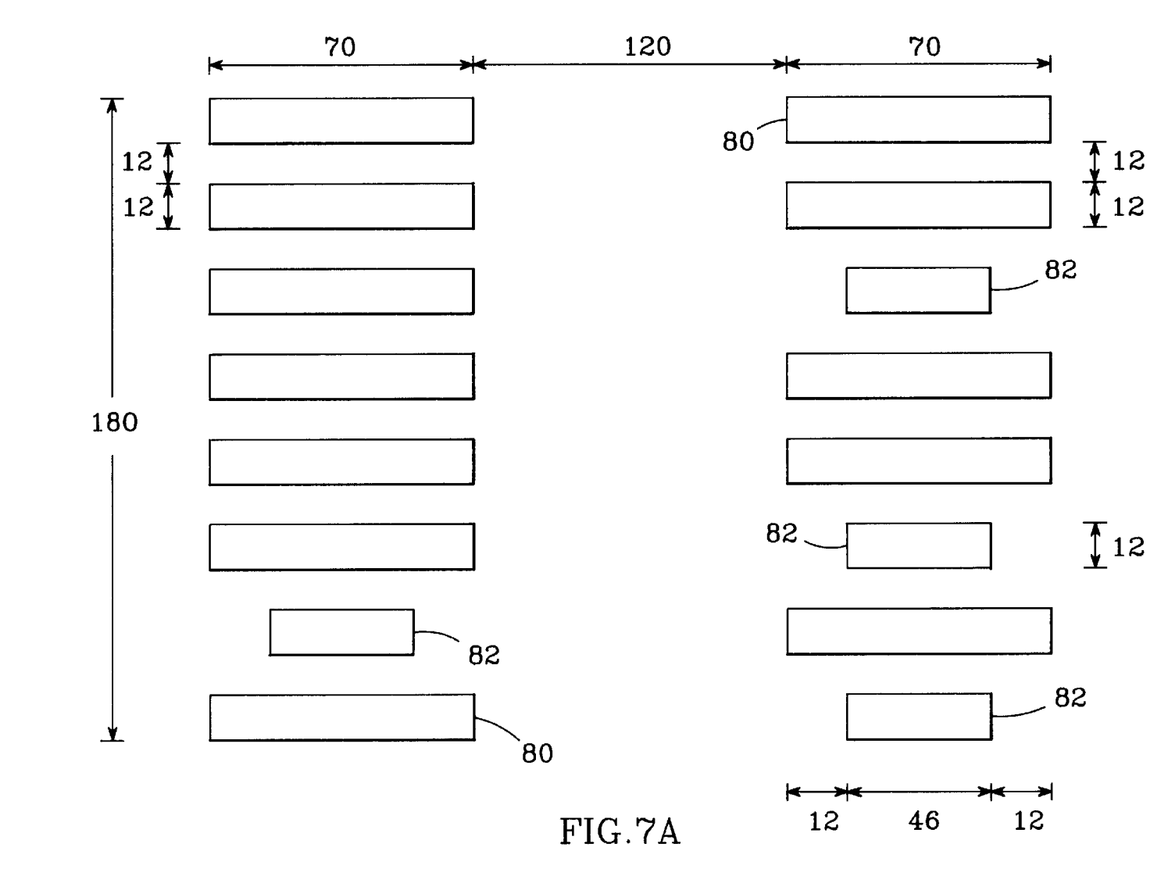
FIG. 7a is a plan view of a component mounting pad layout for a standard thinned shrink small outline package (TSSOP), using reduced-capacitance mounting pads per the present invention. All dimensions shown are in mils.

The use of reduced-capacitance component mounting pads in conjunction with a standard 16-pin "thinned shrink small outline package" (TSSOP) is shown in FIG. 7a. This layout has an overall length dimension of about 180 mils (4.57 mm), a spacing between rows of about 120 mils (3.05 mm), and a spacing between pads of about 12 mils (0.30 mm). A standard component mounting pad 80 for this package has a length dimension of about 70 mils (1.78 mm) and a width of about 12 mils (0.30 mm).

The high frequency leads are preferably soldered to reduced-capacitance component mounting pads 82. These pads preferably have a shortened length dimension of about 46 mils (1.17 mm) and a width of 12 mils (0.30 mm), and are preferably centered between the ends of the standard pads, with a distance of about 12 mils (0.30 mm) between either end of the shortened pad and the end of a standard pad.

The pads 82 shown as shortened in FIG. 7a are merely illustrative; the number and position of the shortened pads is application dependent. The remaining pads are preferably kept at their standard size, to provide a strong mechanical bond between package and board. The reduced-capacitance pads 82 should not, however, be over-shortened: they should be kept long enough to allow a good solder connection to be made. The 46 mils (1.17 mm)×12 mils (0.30 mm) area depicted for the reduced-capacitance pads 82 provides an adequate area for a good solder joint.

Figure 7B:
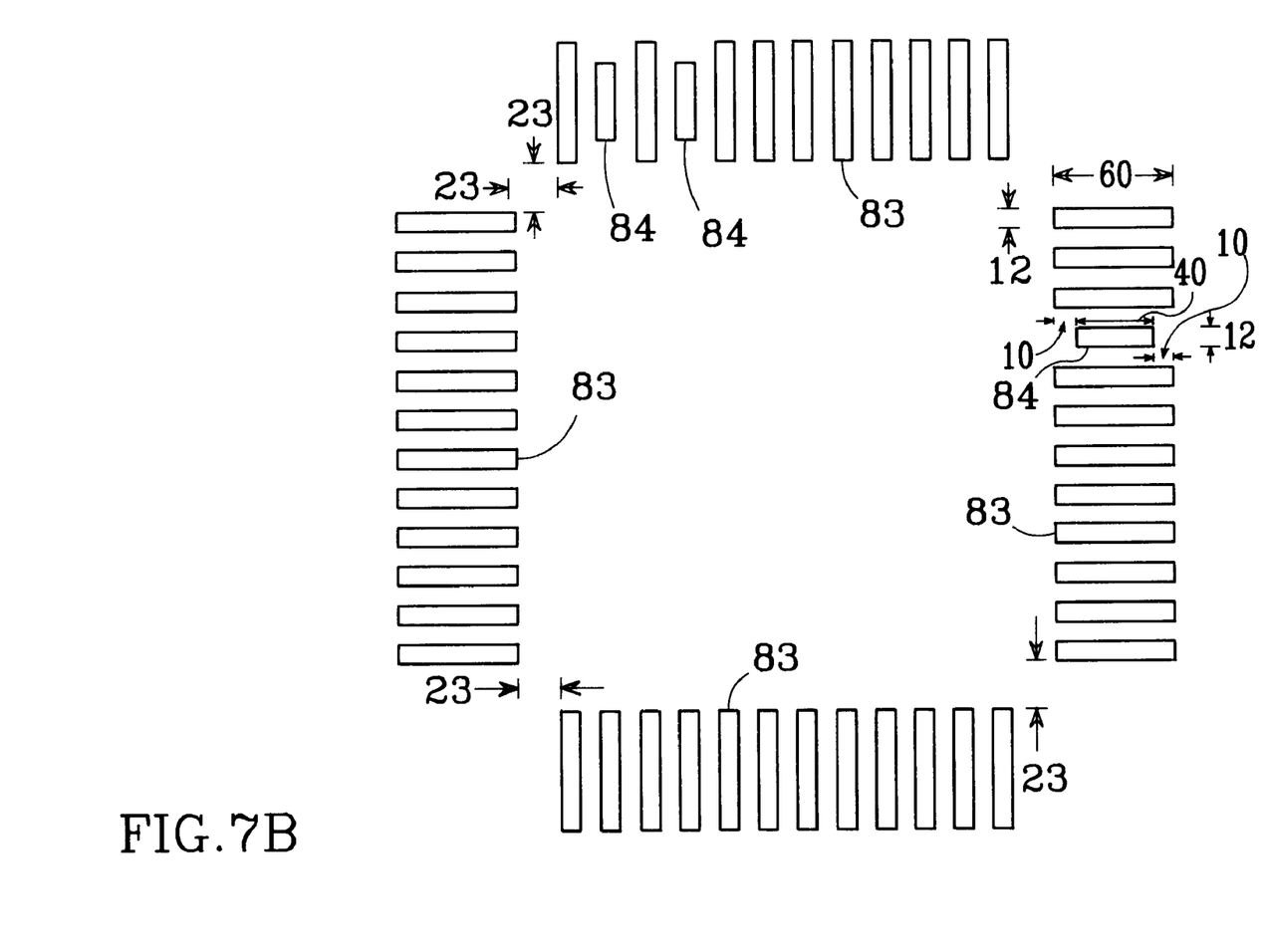
FIG. 7b is a plan view of a component mounting pad layout for a standard thinned quad flat pack (TQFP), using reduced-capacitance mounting pads per the present invention. All dimensions shown are in mils.

Another example of the use of reduced-capacitance component mounting pads is in conjunction with a standard 48-pin "thinned quad flat pack" (TQFP) is shown in FIG. 7b. This layout has a spacing between pads of about 7 mils (0.178 mm). A standard component mounting pad 83 for this package has a length dimension of about 60 mils (1.52 mm) and a width of about 12 mils (0.30 mm).

The high frequency leads are preferably soldered to reduced-capacitance component mounting pads 84. These pads preferably have a shortened length dimension of about 40 mils (1.02 mm) and a width of 12 mils (0.30 mm), and are preferably centered between the ends of the standard pads, with a distance of about 10 mils (0.26 mm) between either end of the shortened pad and the end of a standard pad. As with FIG. 7a, the pads 84 shown as shortened in FIG. 7b are merely illustrative; the number and position of the shortened pads is application dependent.

Figure 8:
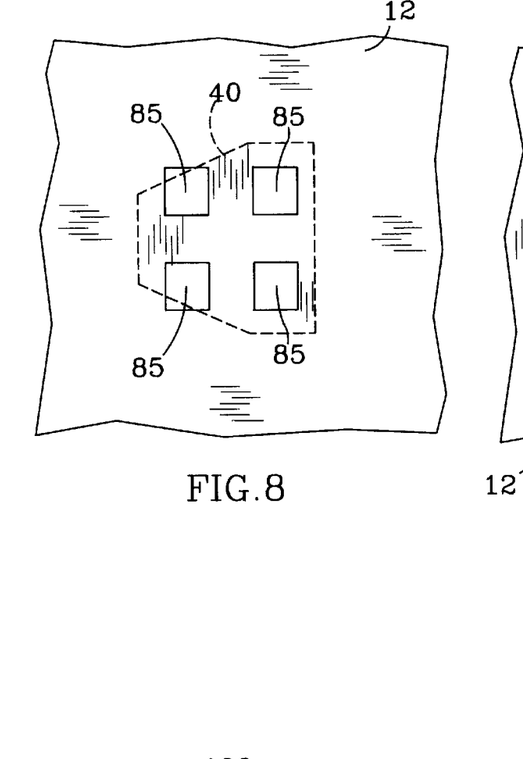
FIG. 8 is a top plan view of a reduced-capacitance mesh ground plane.

In some cases, a further reduction in capacitance is desired beyond that achieved by the new component mounting pads. This can be achieved by reducing the area of the ground plane underlying the mounting pads. As is known in the art, the ground plane 12 provides a number of benefits including a stable, "clean" reference for the RF circuitry and shielding, which substantially reduces interference between the RF circuitry on one side of the ground plane and other circuitry, which may include digital circuit traces, on the other side of the ground plane. To preserve the beneficial effects of the ground plane while reducing the capacitance between the ground plane and component mounting pad, the ground plane underlying a pad is preferably formed of a mesh, as illustrated in FIG. 8. Voids 85 in the ground plane conductor 12 reduce the total area of conductive material underlying the mounting pad, preferably to no more than half the area circumscribed by an overlying pad such as reduced-capacitance pad 40 (shown dashed for clarity). As noted above, the ground plane mesh provides some shielding effects, while at the same time reducing the capacitance between the ground plane and the component mounting pad. Because the mesh area and mounting pad reside on different PC board layers, there is some chance for mis-alignment of the two areas. The voids 85 are preferably distributed evenly throughout the circumscribed area, so that minor misalignments between pad and mesh have little to no effect on capacitance reduction.

Figure 9:
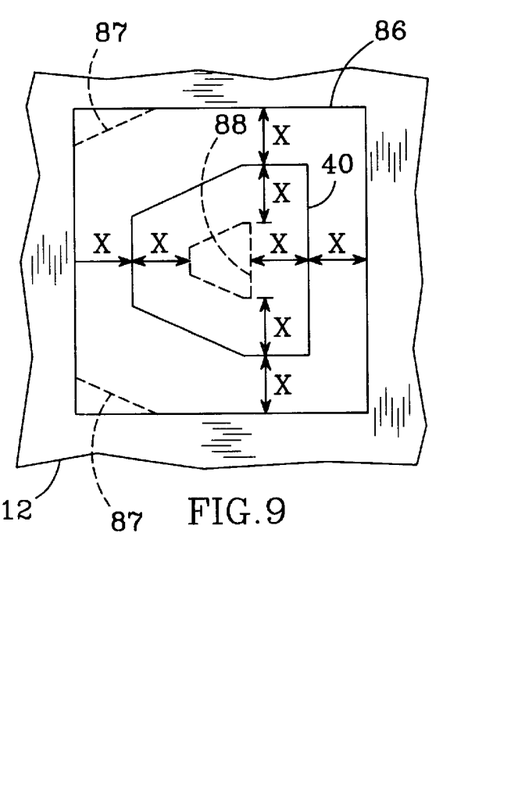
FIG. 9 is a top plan view of a ground plane featuring a capacitance-reducing aperture opposite a reduced-capacitance mounting pad.

In extreme cases, the ground-plane-mesh/reduced-capacitance-pad combination may not reduce capacitance sufficiently. In such cases, the ground plane may be "cut out" to an even greater extent, as illustrated in FIG. 9, by forming an aperture 86 in the ground plane below the reduced-capacitance pad 40. Unfortunately, such a cutout causes the ground plane's shielding benefits to be greatly reduced. Since noise in this frequency range may therefore be coupled between conductive layers through this aperture, circuitry on layers other than that of the mounting pad is preferably routed around the aperture. To reduce fringing effects, the perimeter of the aperture 86 is preferably no closer to the outline of the pad 40 than a distance X, which is preferably the greater of 1) the thickness of the dielectric layer separating the pad 40 and ground plane 12, and 2) the inherent X-Y alignment resolution of the PCB manufacturing process.

The corners of aperture 86 could also be chamfered so that the aperture's perimeter follows the lines 87 shown in FIG. 9, giving the aperture the truncated home plate shape of the pad 40. An aperture of this shape provides nearly the same capacitance reduction benefits as a square cutout, while retaining slightly more of the ground plane's shielding benefits.

A capacitance reduction approach which falls between the mesh ground plane of FIG. 8 and the aperture 86 of FIG. 9 is also shown in FIG. 9. An under-sized aperture 88 is provided below the reduced-capacitance pad 40, rather than an over-sized cutout. The under-sized aperture reduces the parasitic capacitance between pad 40 and the ground plane, while retaining some of the ground plane's shielding benefits. As with the oversized cutout, the undersized cutout 88 preferably tracks the shape of pad 40, to provide the best balance between capacitance reduction and shielding.

The mesh and/or aperture regions of the ground plane 12 discussed in relation to FIGS. 8 and 9 above are preferably achieved using photo-lithographic techniques well-known in the PCB industry. These techniques are useful whether the designer's intent is to simply reduce capacitance as much as possible, or to achieve a particular transmission line impedance. A particular impedance may be obtained by, for example, properly arranging the voids in a ground plane mesh, or by appropriately sizing the aperture opposite a mounting pad. The specific ground plane modifications needed to achieve a particular impedance may be determined by trial and error, or by simulation or modeling methods.

Figure 10:
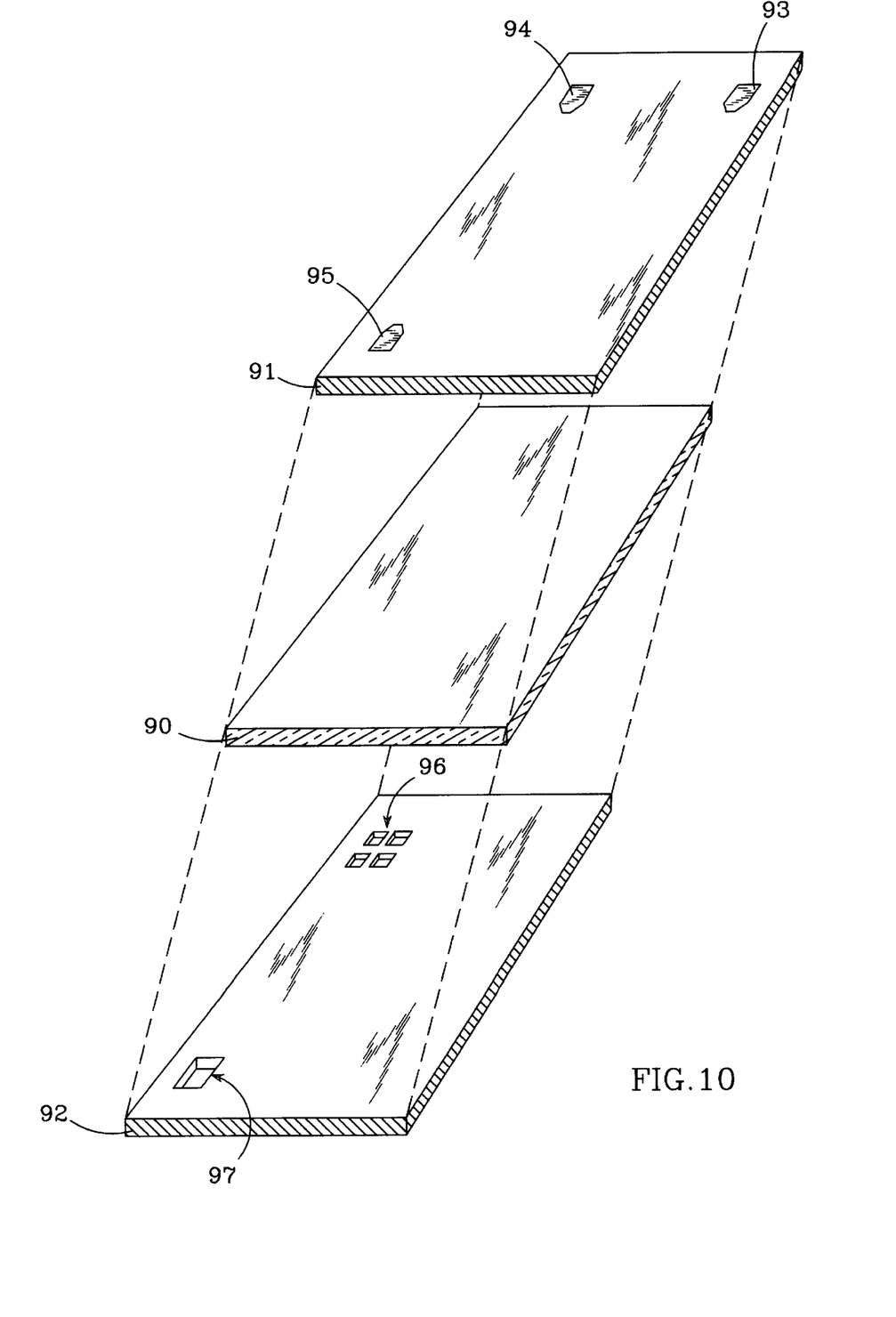
FIG. 10 is an exploded perspective view of a multi-layer PCB incorporating several of the capacitance-reduction techniques disclosed herein.

A multi-layer PCB incorporating the capacitance-reduction techniques disclosed herein is shown in an exploded perspective view in FIG. 10, which depicts a dielectric layer 90 sandwiched between an RF signal layer 91 (shown as a continuous plane for clarity, though in practice it would comprise conductive traces and mounting pads only) and a ground plane 92. Reduced-capacitance component pads 93, 94 and 95 in the RF signal layer are opposite a continuous area of ground plane 92, a mesh area 96 in ground plane 92, and an aperture 97 in ground plane 92, respectively.

Figure 11:
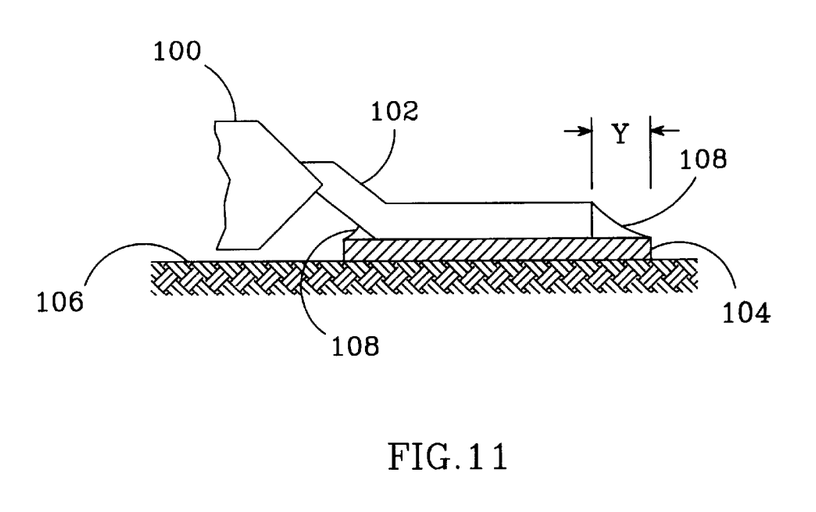
FIG. 11 is an elevation view of an I.C. lead soldered to a reduced-capacitance mounting pad per the present invention.

FIG. 11 is an elevation view of an I.C. lead as might extend from the side of a TSSOP or TQFP I.C. package 100, which shows how additional capacitance reduction is attained with a reduction in the overall length of a component mounting pad. I.C. lead 102 extends from the package and is soldered to a component mounting pad 104 residing on a PCB 106; the pad extends a length Y beyond the edge of lead 102. Conventionally, length Y is made equal to between 30 mils and 50 mils (0.76 mm and 1.27 mm). This excess pad length allows for some misalignment between I.C. and mounting pad, and insures that an adequate surface area is available for fluxing and reflowing during wave soldering. The excess length also results in unwanted parasitic capacitance between the pad 104 and the ground plane of PCB 106. The present invention reduces length Y to between 5–10 mils (0.13 mm–0.26 mm), reducing this unwanted parasitic capacitance. This is made possible with the aid of high-resolution PCB assembly lines having a component placement ability which permits the lowering of the prior art misalignment tolerance. Length Y must, however, still be sufficient to allow the formation of a proper solder fillet 108 between the lead 102 and the pad 104. A length Y of 5–10 mils suffices for this purpose.

The use of one or more of the above-discussed capacitance-reduction techniques can enable the fabrication of high frequency circuits on inexpensive glass-epoxy boards, such as "FR-4" boards manufactured by the Toppan Corp. in San Diego, Calif., from raw stock provided by Nelco Corp. of Fullerton, Calif. Boards made from this material have historically been used for digital and low frequency analog circuits, but have typically been inadequate for high frequency use, particularly with the thinner dielectric layers required by today's technology.

The forgoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described in order to best explain the principles of the invention and its practical application, to thereby enable others skilled in the art to best utilize the invention. It is intended that the scope of the invention be limited only by the claims appended hereto.

We claim:

1. A reduced-capacitance component mounting pad suitable for use on 0402-size high frequency printed circuit boards to reduce parasitic capacitance, comprising:

a dielectric layer, a metallic ground plane layer on one side of said dielectric layer, and a component mounting pad having an area of about 20 mils×20 mils (0.51 mm×0.51 mm) on the opposite side of said dielectric layer from said ground plane layer, the area of said mounting pad being substantially less than that of a corresponding conventional mounting pad for an 0402 chip component size such that the parasitic capacitance between said mounting pad and said ground plane layer is less than would be present between said corresponding conventional 0402 pad and said ground plane layer and enabling a higher transmission line impedance to be achieved for a conductive trace attached to said pad than would be possible with said corresponding conventional 0402 mounting pad attached to said trace, said lesser area sufficient to support a mechanically sound solder joint for a component lead soldered to said pad.

2. The reduced-capacitance component mounting pad of claim 1, further comprising a conductive trace connected to said pad and forming a transmission line, said transmission line having an impedance $Z_0$ equal to $\sqrt{(L/C)}$, in which the lesser area of said reduced-capacitance mounting pad increases the range of possible values of $Z_0$ when compared with said corresponding conventional 0402 pad, said increased range of $Z_0$ values enabling the impedance of said transmission line to be matched to a source or load impedance connected to said transmission line.

3. The reduced-capacitance mounting pad of claim 1, wherein the length of said mounting pad is less than that of said corresponding conventional 0402 mounting pad, said reduced-capacitance mounting pad length sufficient to support a mechanically sound solder fillet for a component lead soldered to said pad, said shorter reduced-capacitance mounting pad further reducing the parasitic capacitance between said reduced-capacitance pad and said ground plane when compared with said corresponding conventional 0402 pad.

4. A reduced-capacitance component mounting pad suitable for use on 0603-size high frequency printed circuit boards to reduce parasitic capacitance, comprising:

a dielectric layer, a metallic ground plane layer on one side of said dielectric layer, and a component mounting pad having an area of less than 28 mils×28 mils (0.71 mm×0.71 mm) on the opposite side of said dielectric layer from said around plane layer, the area of said mounting pad being substantially less than that of a corresponding conventional mounting pad for an 0603 chip component size such that the parasitic capacitance between said mounting pad and said ground plane layer is less than would be present between a corresponding conventional 0603 pad and said ground plane layer and enabling a higher transmission line impedance to be achieved for a conductive trace attached to said pad than would be possible with said corresponding conventional 0603 pad attached to said trace, said lesser area sufficient to support a mechanically sound solder joint for a component lead soldered to said pad.

5. A reduced-capacitance component mounting pad suitable for use on 0805-size high frequency printed circuit boards to reduce parasitic capacitance, comprising:

a dielectric layer, a metallic ground plane layer on one side of said dielectric layer, and a component mounting pad having an area of less than 38 mils×28 mils (0.97 mm×0.71 mm) on the opposite side of said dielectric layer from said ground plane layer, the area of said mounting pad being substantially less than that of a corresponding conventional mounting pad for an 0805 chip component size such that the parasitic capacitance between said mounting pad and said ground plane layer is less than would be present between a corresponding conventional 0805 pad and said ground plane layer and enabling a higher transmission line impedance to be achieved for a conductive trace attached to said pad than would be possible with said corresponding conventional 0805 pad attached to said trace, said lesser area sufficient to support a mechanically sound solder joint for a component lead soldered to said pad.

6. A reduced-capacitance component mounting pad suitable for use on high frequency printed circuit boards to reduce parasitic capacitance, comprising:

a dielectric layer, a metallic ground plane layer on one side of said dielectric layer, and a component mounting pad on the opposite side of said dielectric layer from said ground plane layer, said metallic ground plane layer having a mesh area beneath said component mounting pad such that the parasitic capacitance between said component mounting pad and said ground plane layer is less than would be present between said component mounting pad and said ground plane layer in the absence of said mesh area and thereby enabling a higher transmission line impedance to be achieved for a conductive trace attached to said pad than would be possible in the absence of said mesh area.

7. A reduced-capacitance component mounting pad suitable for use on high frequency printed circuit boards to reduce parasitic capacitance, comprising:

a dielectric layer, a metallic ground plane layer on one side of said dielectric layer, and a component mounting pad on the opposite side of said dielectric layer from said ground plane layer, said metallic ground plane layer having an aperture beneath said component mounting pad such that the parasitic capacitance between said component mounting pad and said ground plane layer is less than would be present between said component mounting pad and said ground plane layer in the absence of said aperture, said component mounting pad residing on a printed circuit board fabricated with a manufacturing process having an associated X-Y alignment resolution, said aperture having a perimeter which overlaps the perimeter of said pad by at least a distance X, where X is the greater of the thickness of said dielectric layer and said associated X-Y alignment resolution.

8. A reduced-capacitance component mounting pad suitable for use on high frequency printed circuit boards to reduce parasitic capacitance, comprising:

a dielectric layer, a metallic ground plane layer on one side of said dielectric layer, and a component mounting pad on the opposite side of said dielectric layer from said ground plane layer, said metallic ground plane layer having an aperture beneath said component mounting pad such that the parasitic capacitance between said component mounting pad and said ground plane layer is less than would be present between said component mounting pad and said ground plane layer in the absence of said aperture, said component mounting pad residing on a printed circuit board fabricated with a manufacturing process having an associated X-Y alignment resolution, said aperture having a perimeter which underlaps the perimeter of said pad by at least a distance X, where X is the greater of the thickness of said dielectric layer and said associated X-Y alignment resolution.

9. A reduced-capacitance component mounting pad for use on an 0603-size multi-layer printed circuit board, comprising:

a rectangular section of metallization, and a trapezoidal section of metallization joined to said rectangular section and forming a reduced-capacitance component mounting pad, the overall length of the combined metallization areas of said reduced-capacitance pad being about 28 mils (0.71 mm), said overall length being less than that of a corresponding conventional component mounting pad for an 0603 chip component size, the width of the rectangular section of said reduced-capacitance pad being about 28 mils (0.71 mm), said width being less than that of said corresponding conventional 0603 pad, said trapezoidal section has opposing parallel sides, one of said parallel sides having a length of about 12 mils (0.30 mm) and the other parallel side having a length of about 28 mils (0.71 mm) for an 0603 chip component size, such that the combined area of the metallization areas is substantially less than the area of said corresponding conventional 0603 pad, thereby reducing the parasitic capacitance between said reduced-capacitance pad and an electrically isolated metal layer when compared with said conventional 0603 pad, said trapezoidal section permitting solder paste applied atop said pad to be drawn to a component lead placed in contact with said trapezoidal section when said solder is melted to provide a good electrical connection, and the area of said rectangular section being sufficient to provide a mechanically sound solder bond.

10. The reduced-capacitance pad of claim 9, wherein the shortest side of the pad is at least as wide as said component lead to which the pad will be joined with solder.

11. A reduced-capacitance component mounting pad for use on an 0805-size multi-layer printed circuit board, comprising:

a rectangular section of metallization, and a trapezoidal section of metallization joined to said rectangular section and forming a reduced-capacitance component mounting pad, the overall length of the combined metallization areas of said reduced-capacitance pad being about 28 mils (0.71 mm), said overall length being less than that of a corresponding conventional component mounting pad for an 0805 chip component size, the width of the rectangular section of said reduced-capacitance pad being about 38 mils (0.97 mm), said width being less than that of said corresponding conventional 0805 pad, said trapezoidal section having opposing parallel sides, one of said parallel sides having a length of about 16 mils (0.41 mm) and the other parallel side having a length of about 38 mils (0.97 mm) for an 0805 chip component size, such that the combined area of the metallization areas is substantially less than the area of said corresponding conventional 0805 pad, thereby reducing the parasitic capacitance between said reduced-capacitance pad and an electrically isolated metal layer when compared with said conventional 0805 pad, said trapezoidal section permitting solder paste applied atop said pad to be drawn to a component lead placed in contact with said trapezoidal section when said solder is melted to provide a good electrical connection, and the area of said rectangular section being sufficient to provide a mechanically sound solder bond.

* * * * *